United States Patent
Kim

(10) Patent No.: US 6,288,971 B1
(45) Date of Patent: Sep. 11, 2001

(54) APPARATUS FOR GENERATING DATA STROBE SIGNAL APPLICABLE TO DOUBLE DATA RATE SDRAM

(75) Inventor: Kwan-Weon Kim, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/603,912

(22) Filed: Jun. 26, 2000

(30) Foreign Application Priority Data

Jun. 28, 1999 (KR) ................................................ 99-25006

(51) Int. Cl.[7] ........................................................ G11C 8/00
(52) U.S. Cl. .................................... 365/233; 365/193
(58) Field of Search ............................. 365/233, 193, 365/194, 189.11, 189.01, 230.01

(56) References Cited

U.S. PATENT DOCUMENTS 6,011,751 * 1/2000 Hirabayashi et al. ............... 365/236
6,052,329 * 4/2000 Nishino et al. ...................... 365/233

* cited by examiner

Primary Examiner—Hoai V. Ho
(74) Attorney, Agent, or Firm—Jacobson Holman PLLC

(57) ABSTRACT

A synchronous memory device having an apparatus for generating a data strobe signal, the apparatus for generating a data strobe signal includes: a preamble control unit for controlling a preamble state of a data strobe signal in response to a data strobe preamble control signal; at least one pair of pull-up/pull-down signal generating unit coupled to the preamble control unit, for receiving pipe counter signals at a first input terminal to generate pull-up and pull-down signals; a common pull-up signal buffering unit for buffering the pull-up signal to generate a buffered pull-up signal, wherein the buffered pull-up signal is commonly inputted to a second input terminal of the pull-up/pull-down signal generating unit; a common pull-down signal buffering unit for buffering the pull-up signal to generate a buffered pull-down signal, wherein the buffered pull-down signal is commonly inputted to a third input terminal of the pull-up/pull-down signal generating unit; and a data strobe signal driving unit for outputting the data strobe signal in response to the pull-up signal, the pull-down signals and a data strobe enable signal.

18 Claims, 5 Drawing Sheets

APPARATUS FOR GENERATING DATA STROBE SIGNAL APPLICABLE TO DOUBLE DATA RATE SDRAM

FIELD OF THE INVENTION

The present invention relates to a synchronous memory device; and, more particularly, to an apparatus for generating a data strobe signal applicable to a double data rate SDRAM.

DESCRIPTION OF THE PRIOR ART

For achieving a high speed of operation in DRAM (dynamic random access memory), synchronous DRAMs (hereinafter, referred to as SDRAMs) have been developed. The SDRAM operates in synchronization with an external clock signal. The SDRAM includes a single data rate (SDR) SDRAM and a double data rate (DDR) SDRAM and the like.

The SDR SDRAM operates in synchronization with rising edges of the external clock, so that one data is processed within one period of the external clock. On the contrary, the DDR SDRAM operates in synchronization with rising and falling edges of a data strobe signal, so that two successive data are processed within one period of the external clock. Therefore, compared with the SDR SDRAM, the DDR SDRAM achieves at least twice the operation speed without increasing a frequency of the external clock. At this time, the data strobe signal is a signal instructing reception of a data to a controller.

FIG. 1 is a timing chart illustrating a data strobe signal generator shown in FIG. 2 at a read operation in case here a burst length is of 2 and a CAS (column address strobe) latency is of 2.5.

Two data DQ are continuously outputted within one period of an external clock signal CLK, being synchronized with rising and falling edges of the data strobe signal DQS. When a read command is inputted, the data strobe signal DQS maintains a high impedance state. Then, the data strobe signal DQS does not becomes a logic low state until one and half period of the external clock CLK elapses from the input of the read command. That state is called a "preamble" state when the data strobe signal DQS is in a logic low state before the data DQ is outputted.

If the data DQ is outputted, the data strobe signal DQS is synchronized with a first output data so that the data strobe signal DQS goes from the preamble state to a logic state. With the next data output, the data strobe signal DQS goes from the logic high state to a logic low state. If successive data are outputted when the burst length is of more that two, the data strobe signal DQS is toggled according to a transition from the logic high state to a logic low state, or vice versa.

When the data output has been completed, the data strobe signal DQS goes again to the high impedance state, informing to an external circuit that there is not data output any longer. At this time, that state is called a "postamble" state when the data strobe signal DQS is in a logic low state before the data strobe signal DQS again becomes the high impedance state.

At this time, a data strobe enable signal QSEN and a data strobe preamble control signal QSEN_PRE are used to control the data strobe signal DQS.

FIG. 2 is a schematic diagram illustrating a conventional data strobe signal generator 200 with preamble control portion 202, signal generating portion 204, and signal driving portion 208, with the signal generating portion 204 including a plurality of pairs 206A, 206B, 216A, 216B, 226A, 226B of pull-up/pull-down signal drivers. FIG. 3 is a circuit diagram illustrating a pull-up/pull-down signal driver 206 shown in FIG. 2.

A structure and operation of the data strobe signal generator 200 and the pull-up/pull-down signal driver is disclosed in a copending U.S Pat. Ser. No. 475,056, filed on Dec. 30, 1999, entitled "DATA STROBE SIGNAL GENERATOR OF SEMICONDUCTOR DEVICE USING TOGGLED PULL-UP AND PULL-DOWN SIGNALS", which is hereby incorporated by reference.

As shown in FIG. 3, it should be noted that each of the pull-up/pull-down signal drivers 206 includes inverters INV31 to INV34 for buffering a pull-up signal PU and a pull-down signal PD. That is, in the conventional data strobe signal generator 200, when the pull-up signal PU and the pull-down signal PD are fed back, the pull-up signal PU and the pull-down signal PD are buffered through two inverters INV31 and INV32, INV33 and INV34, respectively. Therefore, junction capacitance looking from a pull-up node $N_{pu}$ and a pull-down node $N_{pd}$ may be increased, so that an operation speed is reduced. Additionally, as the number of the pipe counter signals PCNT, e.g., PCNT_EVEN<0:2> and PCNT_ODD<0:2>, increases, the junction capacitance at the pull-up node $N_{pu}$ and the pull-down node $N_{pd}$ may be increased much more.

SUMMARY OF THE INVENTION

It is, therefore, an object of the present invention to provide an apparatus for generating a data strobe signal applicable to a double data rate SDRAM, capable of obtaining a stable operation speed regardless of the number of successive output data and reducing a chip size.

It is an aspect of the present invention to provide a 1. A synchronous memory device having an apparatus for generating a data strobe signal, the apparatus for generating a data strobe signal comprising: a preamble control means for controlling a preamble state of a data strobe signal in response to a data strobe preamble control signal; at least one pair of pull-up/pull-down signal generating means coupled to the preamble control means, for receiving pipe counter signals at a first input terminal to generate pull-up and pull-down signals; a common pull-up signal buffering means for buffering the pull-up signal to generate a buffered pull-up signal, wherein the buffered pull-up signal is commonly inputted to a second input terminal of the pull-up/pull-down signal generating means; a common pull-down signal buffering means for buffering the pull-up signal to generate a buffered pull-down signal, wherein the buffered pull-down signal is commonly inputted to a third input terminal of the pull-up/pull-down signal generating means; and a data strobe signal driving means for outputting the data strobe signal in response to the pull-up signal, the pull-down signals and a data strobe enable signal.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 1:
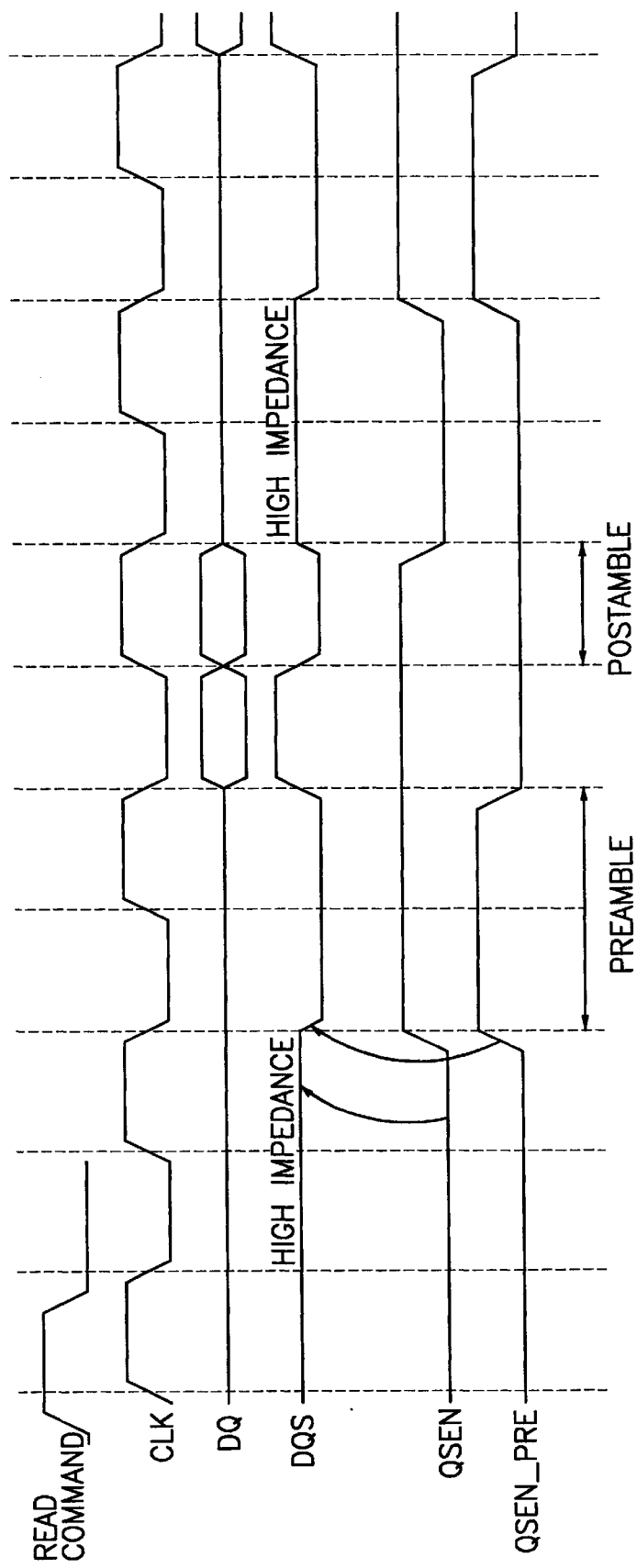
FIG. 1 is a timing chart of a conventional data strobe signal generator at a read operation, when a burst length is of 2 and a CAS latency is of 2.5.
Figure 2:
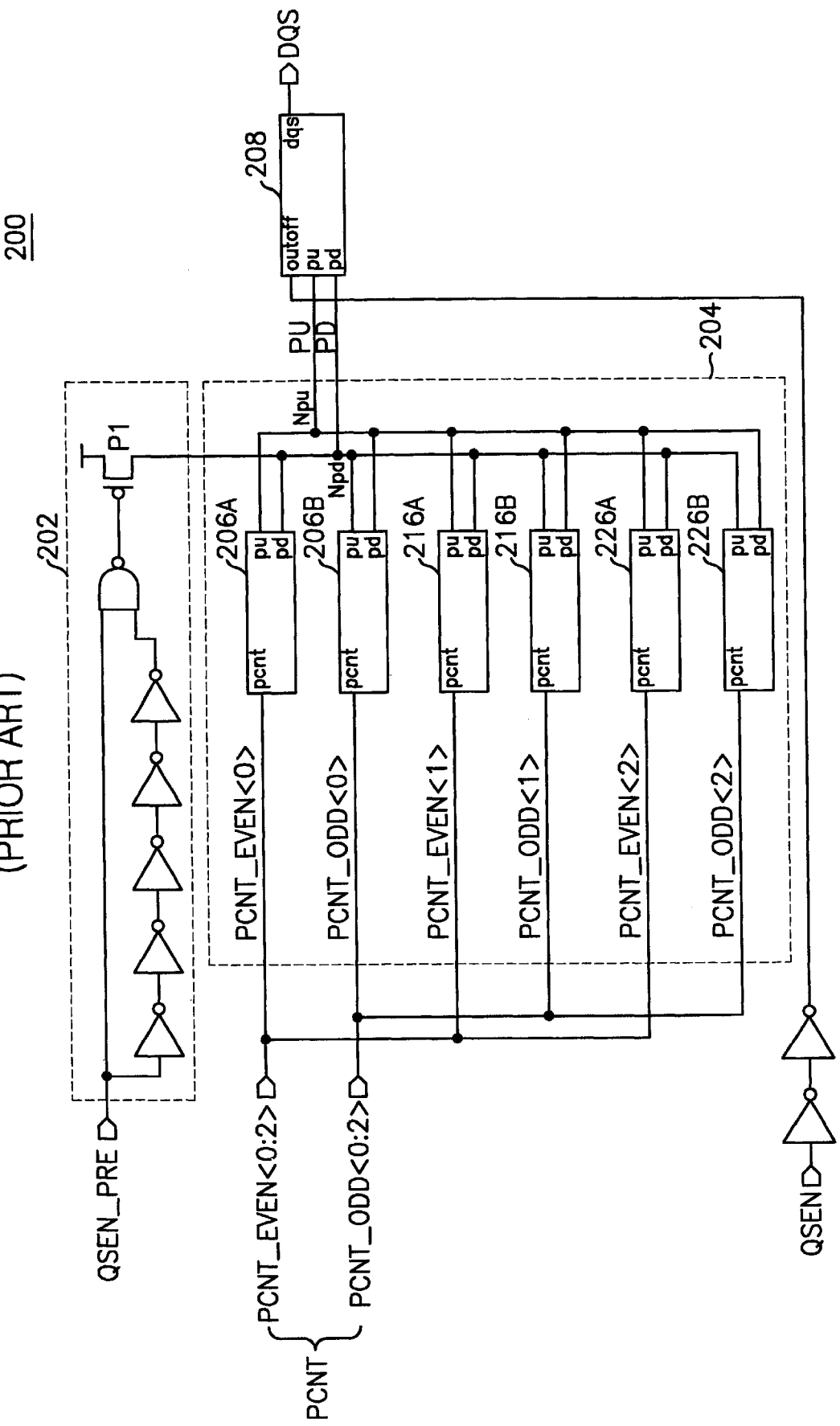
FIG. 2 is a schematic diagram illustrating a conventional data strobe signal generator.
Figure 3:
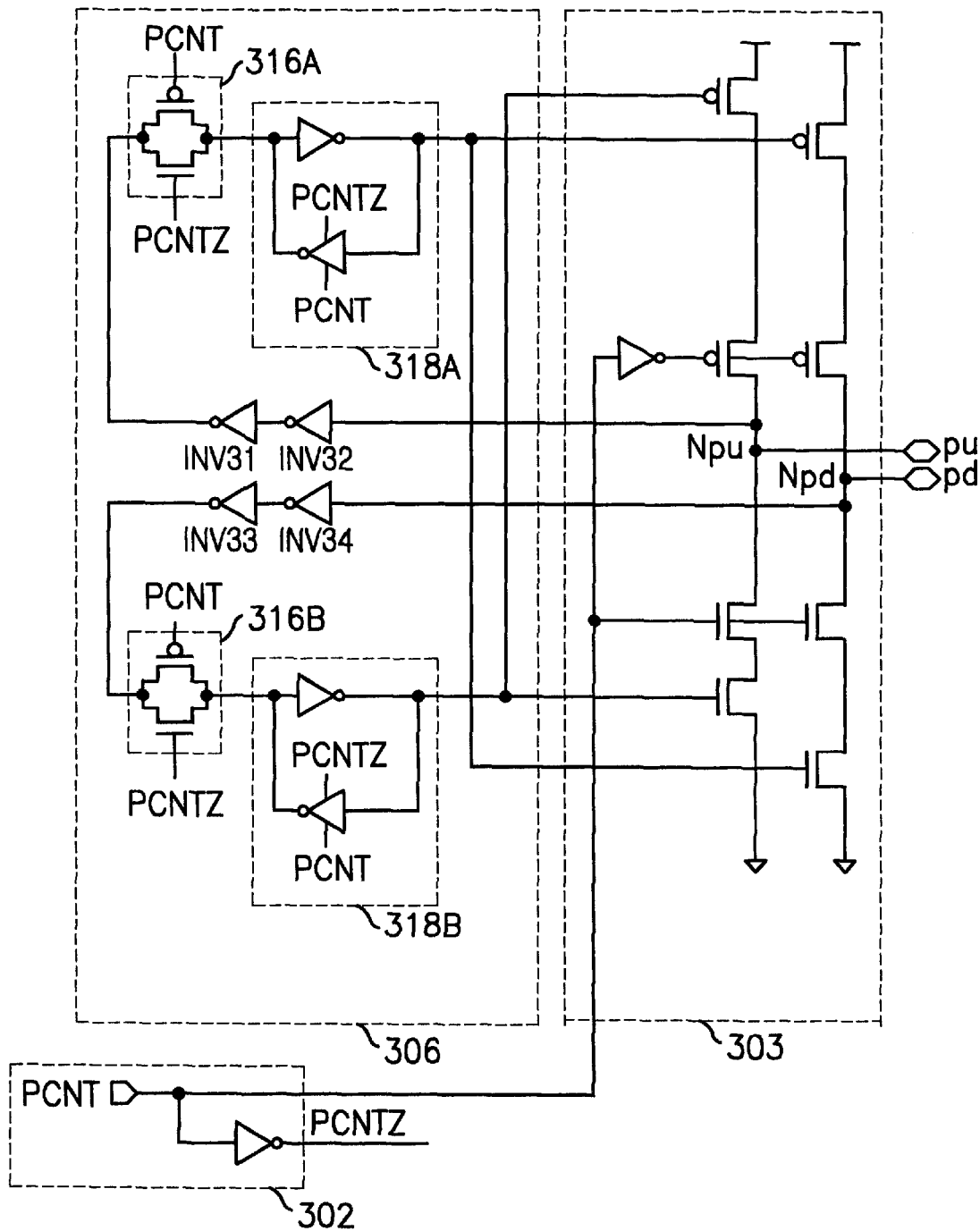
FIG. 3 is a circuit diagram illustrating a pull-up/pull-down signal driver shown in FIG. 2.
Figure 4:
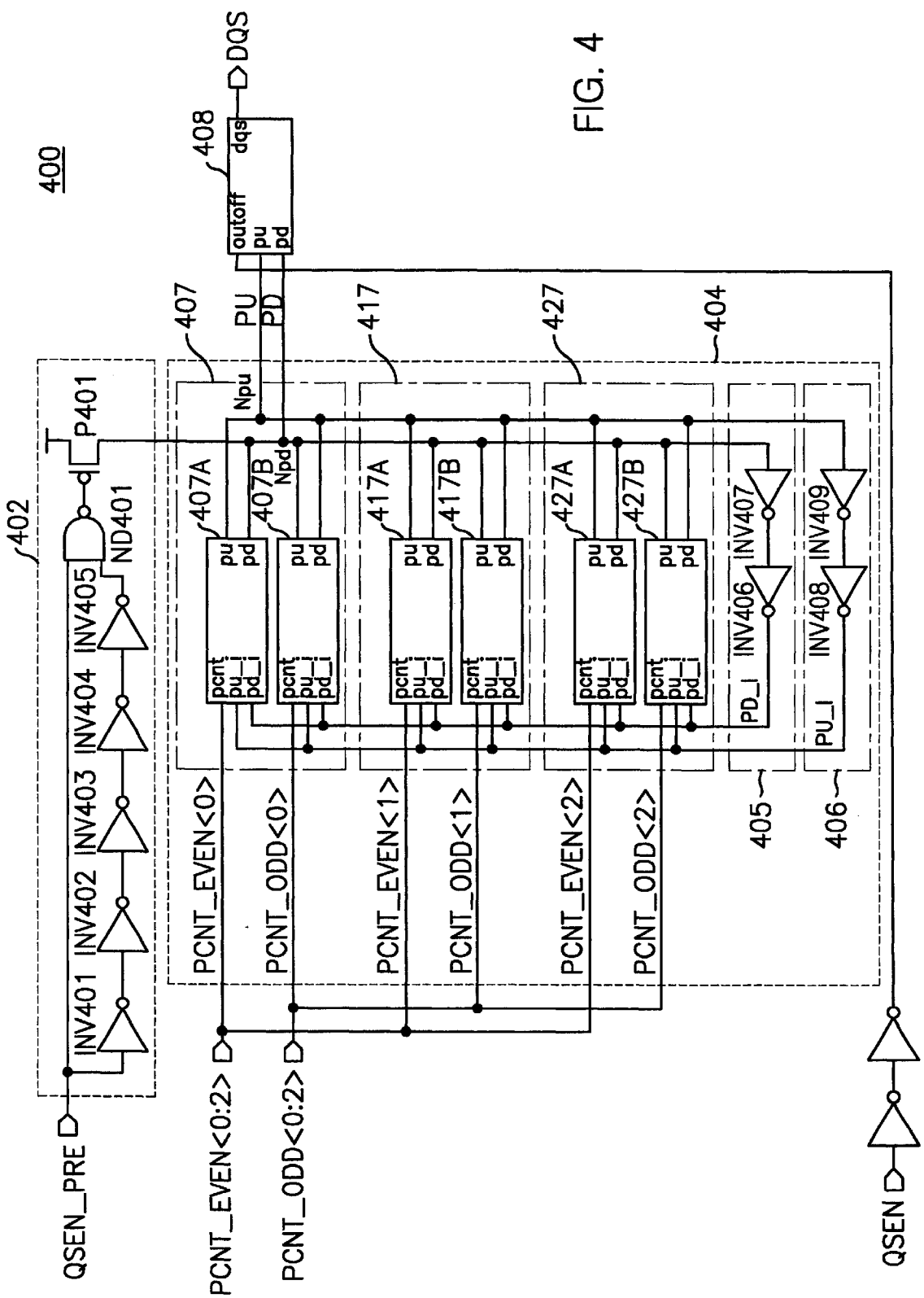
FIG. 4 is a schematic diagram illustrating a data strobe signal generator in accordance with the present invention.

FIG. 4 is a schematic diagram illustrating a data strobe signal generator in accordance with the present invention.

Referring to FIG. 4, the data strobe signal generator 400 includes a preamble control portion 402, a pull-up/pull-down signal generating portion 404, and a data strobe signal driving portion 408.

The preamble control portion 402 controls a preamble state of a data strobe signal DQS in response to a data strobe preamble control signal QSEN_PRE.

The pull-up/pull-down signal generating portion 404 includes a plurality of pairs 407, 417 and 427 of pull-up/pull-down signal drivers for generating the pull-up signal PU and the pull-down signal PD in response to pipe count signal PCNT, a pull-down signal buffer unit 405 for buffering the pull-down signal PD, and a pull-up signal buffer unit 406 for buffering the pull-up signal PU. It should be noted that a buffered pull-up signal PD_I and a buffered pull-down signal PD_I are commonly inputted to each input terminal of the pull-up/pull-down signal drivers.

The data strobe signal driving portion 408 generates the data strobe signal DQS in response to the pull-up signal PU, the pull-down signal PD and a data strobe enable signal QSEN.

The preamble control portion 402 includes a plurality of inverters INV401 to INV405 for delaying the data strobe preamble control signal QSEN_PRE for a predetermined time, a NAND gate ND401 for NANDing the data strobe preamble control signal QSEN_PRE and a delayed data strobe preamble control signal, and a PMOS transistor P401 whose source is coupled to a power terminal and whose gate receives an output signal from the NAND gate ND401.

In the pull-up/pull-down signal generating portion 404, each pair, e.g., 407, includes a first pull-up/pull-down signal driver 407A for receiving a first pipe counter signal PCNT_EVEN<0> to generate the pull-up signal PU and the pull-down signal PD, and a second pull-up/pull-down signal driver 407B for receiving a second pipe counter signal PCNT_ODD<0> to generate the pull-up signal PU and the pull-down signal PD. At this time, a pull-up output terminal of the first pull-up/pull-down signal driver 407A is coupled to a pull-down output terminal of the pull-up/pull-down signal driver 407B. Other pairs 417 and 427 of the pull-up/pull-down signal drivers have the same structure as the pair 417 of the pull-up/pull-down signal drivers.

The pull-down signal buffer unit 405 buffers the pull-down signal PD to generate a buffered pull-down signal PD_I and the pull-up signal buffer unit 406 buffers the pull-up signal PU to generate a buffered pull-up signal PU_I. It should be noted that the buffered pull-down signal PD_I and the buffered pull-up signal PU_I are commonly used as input signals of each pair of the pull-up/pull-down signal drivers.

Figure 5:
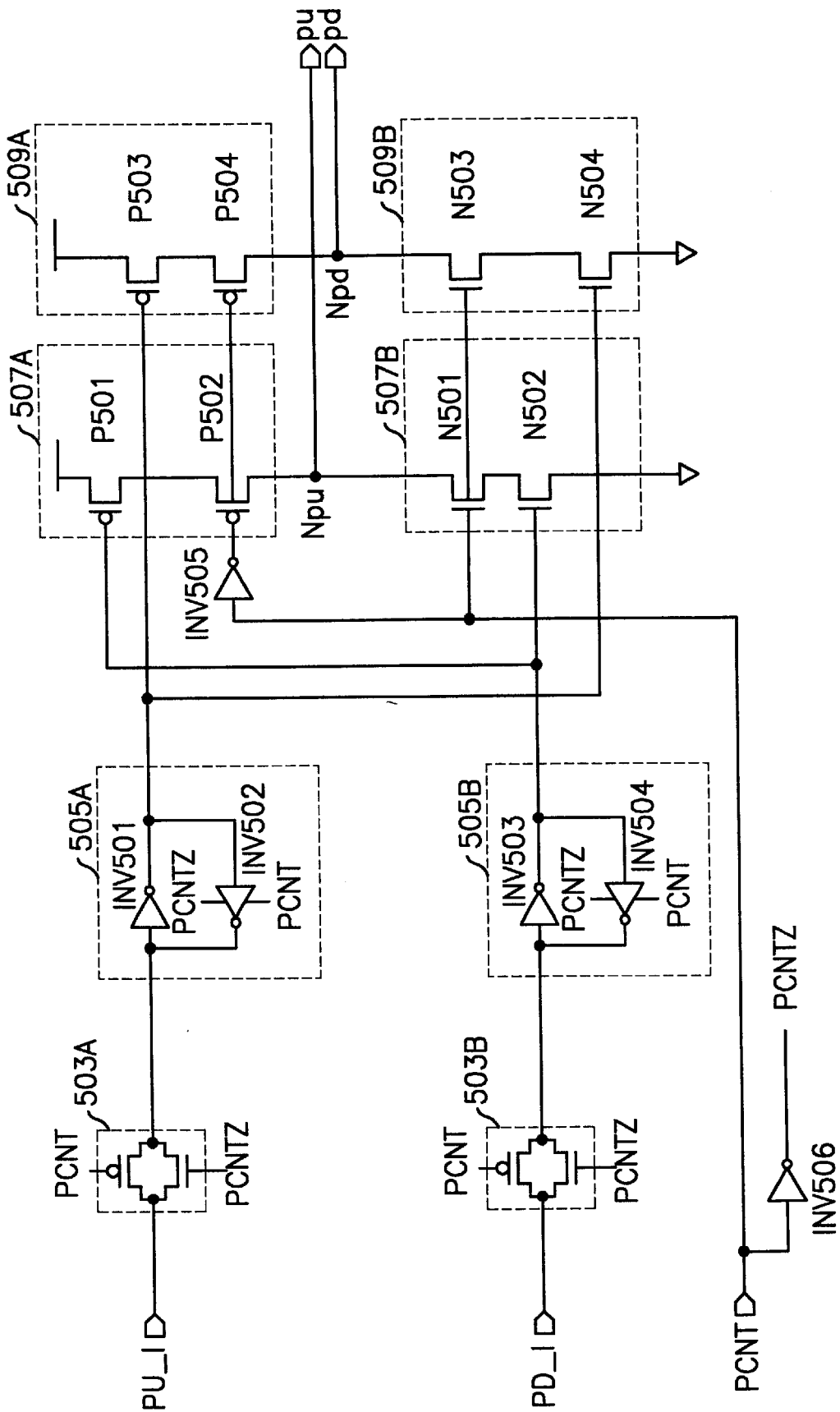
FIG. 5 is a circuit diagram illustrating a pull-up/pull-down signal driver shown in FIG. 4.

Hereinafter, the pull-up/pull-down signal driver will be described in detail with reference to FIG. 5.

A first pass gate 503A receives the buffered pull-up signal PU_I and outputs the buffered pull-up signal PU_I in response to the pipe counter signal PCNT and the inverted pipe counter signal PCNTZ. A second pass gate 503B receives the buffered pull-down signal PD_I and outputs the buffered pull-down signal PD_I in response to the pipe counter signal PCNT and the inverted pipe counter signal PCNTZ.

A first latch circuit 505A latches the buffered pull-up signal PU_I in response to the pipe counter signal PCNT and the inverted pipe counter signal PCNTZ to generate a buffered and latched pull-up signal. A second latch circuit 505B latches the buffered pull-down signal PD_I in response to the pipe counter signal PCNT and the inverted pipe counter signal PCNTZ to output a buffered and latched pull-down signal.

A first pull-up unit 507A drives to pull up the pull-up signal PU in response to the buffered and latched pull-down signal and the inverted pipe counter signal PCNTZ. A first pull-down unit 507B drives to pull down the pull-up signal PU in response to the buffered and latched pull-down signal and the pipe counter signal PCNT.

A second pull-up unit 509A drives to pull up the pull-down signal PD in response to the buffered and latched pull-up signal and the inverted pipe counter signal PCNTZ. A second pull-down unit 509B drives to pull down the pull-down signal PD in response to the buffered and latched pull-up signal and the pipe counter signal PCNT.

The first latch circuit 505A is preferably implemented with an inverter INV501 and a tri-state inverter INV502. The inverter INV501 has an input terminal receiving the buffered pull-up signal PU_I. The tri-state inverter INV502 has an input terminal coupled to an output terminal of the inverter INV501, and an output terminal coupled to the input terminal of the inverter INV501. At this time, the tri-state inverter INV502 is driven in response to the pipe counter signal PCNT and the inverted pipe counter signal PCNTZ.

The latch circuit 505B has the same structure as the latch circuit 505A.

The first pull-up unit 507A includes a PMOS transistor P501 whose source is coupled to the power terminal and whose gate receives the output signal from the latch circuit 505B, and a PMOS transistor P502 whose source is coupled to a drain of the PMOS transistor P501, whose drain is coupled to a pull-up node $N_{pu}$, and whose gate receives the inverted pipe counter signal PCNTZ. An output signal at the pull-up node $N_{pu}$ corresponds to the pull-up signal PU.

The second pull-up unit 509A includes a PMOS transistor P503 whose source is coupled to the power terminal and whose gate receives the output signal from the latch circuit 505A, and a PMOS transistor P504 whose source is coupled to a drain of the PMOS transistor P503, whose drain is coupled to a pull-down node $N_{pd}$, and whose gate receives the inverted pipe counter signal PCNTZ. An output signal at the pull-down node $N_{pd}$ corresponds to the pull down signal PU.

The first pull-down unit 507B includes an NMOS transistor N501 whose drain is coupled to the drain of the PMOS transistor P502 and whose gate receives the pipe counter signal PCNT, and an NMOS transistor N502 having a drain coupled to a source of the NMOS transistor N501, a source coupled to a ground terminal and a gate receives the output signal from the latch circuit 505B.

The second pull-down unit 509B includes an NMOS transistor N503 whose drain is coupled to the drain of the PMOS transistor P504 and whose gate receives the pipe counter signal PCNT, and an NMOS transistor N504 having a drain coupled to a source of the NMOS transistor N503, a source coupled to the ground terminal and a gate receiving the output signal from the latch circuit 505A.

Hereinafter, an operation of the data strobe signal generator will be described in detail with reference to FIGS. 4 and 5.

First, the preamble control portion 402 senses a rising edge of the data strobe preamble control signal QSEN_PRE to generate a preamble control pulse having a predetermined pulse width. The preamble control pulse is a low enable signal which is activated when a high-to-low logic transition is achieved. The preamble control pulse applied to a gate of the PMOS transistor P401 causes the pull-down signal PD to be in a logic high state.

At this time, since the pipe counter signal PCNT applied to the pull-up/pull-down signal generating portion 404 is in a low state, the pull-up/pull-down signal generating portion 404 is disabled. Therefore, the buffered pull-up signal PU_I and the buffered pull-down signal PD_I is not outputted as an output signal and the pull-up/pull-down signal generating portion 404 maintains a previous pull-up and pull-down signal.

Next, when an initial pipe counter signal PCNT_EVEN <0> is inputted as a high state, the activated pull-up/pull-down signal driver 407A outputs a signal having an inverted phase of a previous state. The output signal is buffered through the pull-down signal buffer unit 405 and the pull-up signal buffer unit 406, and the buffered signals PU_I and PD_I are inputted to the input terminals of all the pull-up/pull-down signal drivers. Consequently, all other pipe counters including the next pipe counter 407B have an inverted phase of PU_I and PD_I. And then, a next pipe counter enable signal PCNT_ODD<0> is activated to a high state. Accordingly, the activated pull-up/pull-down signal driver 407B outputs a signal having an inverted phase of a previous state. Furthermore, the pull-up and pull-down signal is again buffered and fed back to the input terminal of the pull-up/pull-down signal driver 417A.

In the same manner, according as the pull-up and pull-down signal PU and PD are sequentially toggled in response to the pipe counter signal PCNT, the data strobe signal DQS is also toggled. When the operation is completed, the data strobe enable signal QSEN is disabled to a low state. As a result, the pull-up node $N_{pu}$ and the pull-down node $N_{pd}$ become a low state, so that the data strobe signal DQS becomes a high impedance state.

As described above, by buffering the pull-up signal and the pull-down signal with the common buffer unit, junction capacitance at the pull-up node and the pull-down node is decreased, thereby reducing a chip size and improving an operation speed. Although the number of successive output data is increased, the data strobe signal generator according to the present invention can obtain a constant operation speed.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A synchronous memory device having an apparatus for generating a data strobe signal, the apparatus for generating the data strobe signal comprising:

a preamble control means for controlling a preamble state of the data strobe signal in response to a data strobe preamble control signal;

at least one pair of pull-up/pull-down signal generating drivers coupled to the preamble control means, each driver within said at least one pair having a first input terminal, a second input terminal and a third input terminal, each driver within said at least one pair for receiving a pipe counter signal at said first input terminal to generate a pull-up signal and a pull-down signal;

a common pull-up signal buffering means for buffering the pull-up signal to generate a buffered pull-up signal, wherein the buffered pull-up signal is commonly inputted to said second input terminal of each driver of said at least one pair of pull-up/pull-down signal generating drivers;

a common pull-down signal buffering means for buffering the pull-down signal to generate a buffered pull-down signal, wherein the buffered pull-down signal is commonly inputted to said third input terminal of each driver of said at least one pair of pull-up/pull-down signal generating drivers; and a data strobe signal driving means for outputting the data strobe signal in response to the pull-up signals, the pull-down signals and a data strobe enable signal.

2. The synchronous memory device as recited in claim 1, wherein the preamble control means includes:

a plurality of inverters for delaying the data strobe preamble control signal for a predetermined time;

a NAND gate for NANDing the data strobe preamble control signal and a delayed data strobe preamble control signal; and a PMOS transistor having a source coupled to a power terminal, a gate receiving an output signal of the NAND gate, and a drain coupled to the pull-down node.

3. The synchronous memory device as recited in claim 1, wherein the pull-up/pull-down signal generating drivers include:

a plurality of pairs of pull-up/pull-down signal drivers, wherein each pair of the pull-up/pull-down drivers has a first pull-up/pull-down driver for receiving a first pipe counter signal to generate the pull-up and pull-down signals, and a second pull-up/pull-down driver for receiving a second pipe counter signal to output the pull-down signal and the pull-up signal, each of the pull-up and pull-down signals coupled to one of said common pull-up signal buffering means and said common pull-down signal buffering means;

wherein a pull-up output terminal of the first pull-up/pull-down driver is coupled to a pull-down output terminal of the second pull-up/pull-down driver; and wherein a pull-down output terminal of the first pull-up/pull-down driver is coupled to a pull-up output terminal of the second pull-up/pull-down driver.

4. The synchronous memory device as recited in claim 1, wherein the common pull-up signal buffering means includes:

a predetermined number of inverters for receiving and buffering the pull-up signal to output the buffered pull-up signal.

5. The synchronous memory device as recited in claim 1, wherein the common pull-down signal buffering means includes:

a predetermined number of inverters for receiving and buffering the pull-down signal to output the buffered pull-down signal.

6. The synchronous memory device as recited in claim 3, wherein each of the pull-up/pull-down drivers includes:

a first pass gate for transferring the buffered pull-up signal in response to the pipe counter signal;

a first latch circuit for latching the buffered pull-up signal from the first pass gate in response to the pipe counter signal to output a buffered and latched pull-up signal;

a second pass gate for transferring the buffered pull-down signal in response to the pipe counter signal;

a second latch circuit for latching the buffered pull-down signal from the second pass gate in response to the pipe counter signal to output a buffered and latched pull-down signal;

a first pull-up means for driving to pull up the pull-up signal in response to the inverted pipe count signal and the buffered and latched pull-down signal;

a first pull-down means for driving to pull down the pull-up signal in response to the pipe count signal and the buffered and latched pull-down signal;

a second pull-up means for driving to pull up the pull-down signal in response to the buffered and latched pull-up signal and the inverted pipe counter signal; and a second pull-down means for driving to pull down the pull-down signal in response to the buffered and latched pull-up signal and the pipe counter signal.

7. The synchronous memory device as recited in claim 6, wherein the first latch circuit includes:

an inverter having an input terminal receiving the buffered pull-up signal from the first pass gate; and a tri-state inverter driven in response to the inverted pipe counter signal and the pipe counter signal, whose input terminal is coupled to an output terminal of the inverter and whose output terminal is coupled to the input terminal of the inverter.

8. The synchronous memory device as recited in claim 6, wherein the second latch circuit includes:

an inverter having an input terminal receiving the buffered pull-down signal from the second pass gate; and a tri-state inverter driven in response to the inverted pipe counter signal and the pipe counter signal, whose input terminal is coupled to an output terminal of the inverter, and whose output terminal is coupled to the input terminal of the inverter.

9. The synchronous memory device as recited in claim 6, wherein the first pull-up means includes:

a first PMOS transistor having a source coupled to the power terminal and a gate receiving the buffered and latched pull-down signal; and a second PMOS transistor having a source coupled to a drain of the first PMOS transistor, a drain coupled to the pull-up node, and a gate receiving the inverted pipe counter signal.

10. The synchronous memory device as recited in claim 9, wherein the second pull-up means includes:

a third PMOS transistor having a source coupled to the power terminal and a gate receiving the buffered and latched pull-up signal; and a fourth PMOS transistor having a source coupled to a drain of the third PMOS transistor, a drain coupled to the pull-down node, and a gate receiving the inverted pipe counter signal.

11. The synchronous memory device as recited in claim 10, wherein the first pull-down means includes:

a first NMOS transistor having a drain coupled to the pull-up node and a gate receiving the pipe counter signal; and a second NMOS transistor having a drain coupled to a source of the first NMOS transistor, a source coupled to a ground terminal, and a gate receiving the buffered and latched pull-down signal.

12. The synchronous memory device as recited in claim 11, wherein the second pull-down means includes:

a third NMOS transistor having a drain coupled to the pull-down node and a gate receiving the pipe counter signal; and a fourth NMOS transistor having a drain coupled to a source of the third NMOS transistor, a source coupled to the ground terminal, and a gate receiving the buffered and latched pull-up signal.

13. A synchronous memory device having an apparatus for generating a data strobe signal, the apparatus for generating the data strobe signal comprising:

a preamble control means for controlling a preamble state of the data strobe signal in response to a data strobe preamble control signal;

a plurality of pairs of pull-up/pull-down signal generating drivers coupled to the preamble control means, each pair of pull-up/pull-down drivers having a first pull-up/pull-down driver for receiving a first pipe counter signal to generate the pull-up and pull-down signals, and a second pull-up/pull-down driver for receiving a second pipe counter signal to output the pull-down signal and the pull-up signal, each driver having a first input terminal, a second input terminal and a third input terminal;

a common pull-up signal buffering means for buffering the pull-up signal to generate a buffered pull-up signal, wherein the buffered pull-up signal is commonly inputted to said second input terminal of each driver, said common pull-up signal buffering means coupled to receive from each driver one of the pull-up signal and the pull-down signal output from each driver;

a common pull-down signal buffering means for buffering the pull-down signal to generate a buffered pull-down signal, wherein the buffered pull-down signal is commonly inputted to said third input terminal of each driver, said common pull-down signal buffering means coupled to receive from each driver one of the pull-up signal and the pull-down signal output from each driver; and a data strobe signal driving means for outputting the data strobe signal in response to the pull-up signals, the pull-down signals and a data strobe enable signal.

14. A synchronous memory device having an apparatus for generating a data strobe signal, the apparatus for generating the data strobe signal comprising:

a preamble control means for controlling a preamble state of the data strobe signal in response to a data strobe preamble control signal;

a signal generating portion including a plurality of pairs of pull-up/pull-down signal generating drivers coupled to the preamble control means, a first pair of pull-up/pull-down drivers having a first pull-up/pull-down driver for receiving a first pipe counter signal to generate the pull-up and pull-down signals, and a second pull-up/pull-down driver for receiving a second pipe counter signal to output the pull-down signal and the pull-up signal, a second pair of pull-up/pull-down drivers having a third pull-up/pull-down driver for receiving a third pipe counter signal to generate the pull-up and pull-down signals, and a fourth pull-up/pull-down driver for receiving a fourth pipe counter signal to output the pull-down signal and the pull-up signal, and a third pair of pull-up/pull-down drivers having a fifth pull-up/pull-down driver for receiving a fifth pipe counter signal to generate the pull-up and pull-down signals, and a sixth pull-up/pull-down driver for receiving a sixth pipe counter signal to output the pull-down signal and the pull-up signal, each driver having a first input terminal, a second input terminal and a third input terminal;

a common pull-up signal buffering means for buffering the pull-up signal to generate a buffered pull-up signal, wherein the buffered pull-up signal is commonly inputted to said second input terminal of each driver, said common pull-up signal buffering means coupled to receive from each driver one of the pull-up signal and the pull-down signal output from each driver;

a common pull-down signal buffering means for buffering the pull-down signal to generate a buffered pull-down signal, wherein the buffered pull-down signal is commonly inputted to said third input terminal of each driver, said common pull-down signal buffering means coupled to receive from each driver one of the pull-up signal and the pull-down signal output from each driver; and a data strobe signal driving means for outputting the data strobe signal in response to the pull-up signals, the pull-down signals and a data strobe enable signal.

15. The synchronous memory device as recited in claim 14, wherein when said signal generating portion is disabled, the buffered pull-up signal and the buffered pull-down signal are not output and said signal generating portion maintains a previous pull-up and pull-down signal.

16. The synchronous memory device as recited in claim 15, wherein when said first pipe counter signal in input as a high state, the first pull-up/pull-down driver is activated and outputs a signal having an inverted phase of a previous state, the output signal from the first pull-up/pull-down driver is then buffered through said common pull-up and pull-down signal buffering means, and the buffered pull-up signal is input to the second input terminal of each driver and the buffered pull-down signal is input to the third input terminal of each driver, such that a next pipe counter signal has an inverted phase of the buffered pull-up signal and the buffered pull-down signal.

17. The synchronous memory device as recited in claim 16, wherein when said second pipe counter signal is next input as a high state, the second pull-up/pull-down driver is activated and outputs a signal having an inverted phase of a previous state, the output signal from the second pull-up/pull-down driver is then buffered through said common pull-up and pull-down signal buffering means, and the buffered pull-up signal is input to the second input terminal of each driver and the buffered pull-down signal is input to the third input terminal of each driver, such that a next pipe counter signal has an inverted phase of the buffered pull-up signal and the buffered pull-down signal.

18. The synchronous memory device as recited in claim 17, wherein as each of said third, fourth, fifth and sixth drivers are activated in turn by said third, fourth, fifth and sixth pipe counter signals being input, respectively, as a high state, the pull-up and pull-down signals are sequentially toggled, and the data strobe signal is also sequentially toggled.

* * * * *